United States Patent

Dunn et al.

[15] 3,668,553

[45] June 6, 1972

[54] DIGITALLY TUNED STRIPLINE OSCILLATOR

[72] Inventors: Vernon E. Dunn, Mountain View; Arthur B. Vane, Menlo Park, both of Calif.

[73] Assignee: Varian Associates, Palo Alto, Calif.

[22] Filed: June 26, 1970

[21] Appl. No.: 50,266

[52] U.S. Cl. ....................331/107 G, 331/96, 331/101, 331/179, 333/84 M

[51] Int. Cl. ....................H03b 7/06

[58] Field of Search ....................331/107, 101, 96, 179; 333/84 M

[56] References Cited

UNITED STATES PATENTS

| | | | |
|---|---|---|---|
| 3,319,187 | 5/1967 | Crandall | 331/117 |
| 3,417,351 | 12/1968 | di Piazza | 334/15 |
| 3,534,301 | 10/1970 | Golembeski | 333/84 M |

OTHER PUBLICATIONS

D. D. King, Electronics, Pgs. 184– 186, March 1954.

T. Ikoma, IEEE JN of Solid State Circuits, Vol. SC–2, No. 3, Sept. 1967, pgs. 108– 113.

Microwaves, " Digital Tuning Imposes Will On Cavity Oscillators," July 1969.

*Primary Examiner*—John Kominski

*Attorney*—Stanley Z. Cole

[57] ABSTRACT

A digitally tuned microwave microstrip oscillator is disclosed. The oscillator includes a resonant section of stripline having a Gunn diode connected between the stripline and ground plane at a low impedance point and having one or more tuning capacitors connected via p-i-n diodes between a high voltage portion of the stripline resonator and the ground plane. Means are provided for selectively biasing one or more of the p-i-n diodes to a conductive state for switching one or more of the tuning capacitors across the resonant stripline for digitally tuning the resonator and oscillator in discrete frequency steps according to the switched condition of the diodes.

8 Claims, 4 Drawing Figures

INVENTORS
VERNON E. DUNN
ARTHUR B. VANE

BY Stanley Z. Cole
ATTORNEY

INVENTORS
VERNON E. DUNN
ARTHUR B. VANE
BY
ATTORNEY

DIGITALLY TUNED STRIPLINE OSCILLATOR

DESCRIPTION OF THE PRIOR ART

Heretofore, bulk-effort oscillators have been continuously tuned over a range of frequencies, in an analog fashion, by means of YIG resonators or varactors. See, for example, an article titled "YIG-Tuned Gun Effect Oscillators" appearing in the Proceedings of the IEEE (Letters), Vol. 55, page 16,21, of September 1967 and an article titled "Varactor-Tuned Integrated GunnOscillators, " presented at the 1968 International Solid-State Circuits Conference in Philadelphia, Pa.

The Gunn-effect oscillators are also known from the prior art. Such an oscillator is disclosed and claimed in U.S. Pat No. 3,416,099 issued Dec. 10, 1968 and assigned to the same assignee as the present invention.

It is also known from the prior art that resonant circuits may be digitally tuned in quantized frequency steps by switching one or more diodes connected to the resonator for switching more or less reactance into the resonator circuit. Such digitally tuned resonant circuits are described in a bulletin titled "Micronotes," Vol. 2, No. 9, of March 1965 published by Microwave Associates, Inc. of Burlington, Mass.

SUMMARY OF THE PRESENT INVENTION

The principal object of the present invention is the provision of an improved tunable stripline oscillator.

One feature of the present invention is the provision in a bulk-effect microwave stripline oscillator of means for tuning the frequency of the oscillator in discrete frequency increments and including a turning capacitor and diode series connected with each other and in shunt across the stripline and means for switching the diode to a conductive state for switching the tuning capacitor across the stripline to shift the frequency of the oscillator from a first frequency to a second frequency in a discrete frequency step.

Another feature of the present invention is the same as the preceding feature wherein the tuning capacitor and the diode are connected across the stripline at a point near a microwave voltage maximum for the fundamental resonant mode of the stripline resonator.

Another feature of the present invention is the same as any one or more of the preceding features wherein the stripline resonator includes a slab of dielectric materials having first and second metallic layers bonded to opposite sides thereof in transverse registration, commonly known as "microstrip," and wherein the slab is apertured at one end to receive the bulk-effect semiconductive device.

Another feature of the present invention is the same as any one or more of the preceding features wherein the tuning capacitor is formed by a sheet of dielectric material disposed overlaying one of the conductors of the stripline with a conductive tab disposed over the dielectric sheet to define the tuning capacitor.

Other features and advantages of the present invention will become apparent upon a perusal of the following specification taken in connection with the accompanying drawings wherein:

DESCRIPTION OF THE PREFERRED EMBODIMENTS

Figures 1, 2, 3:
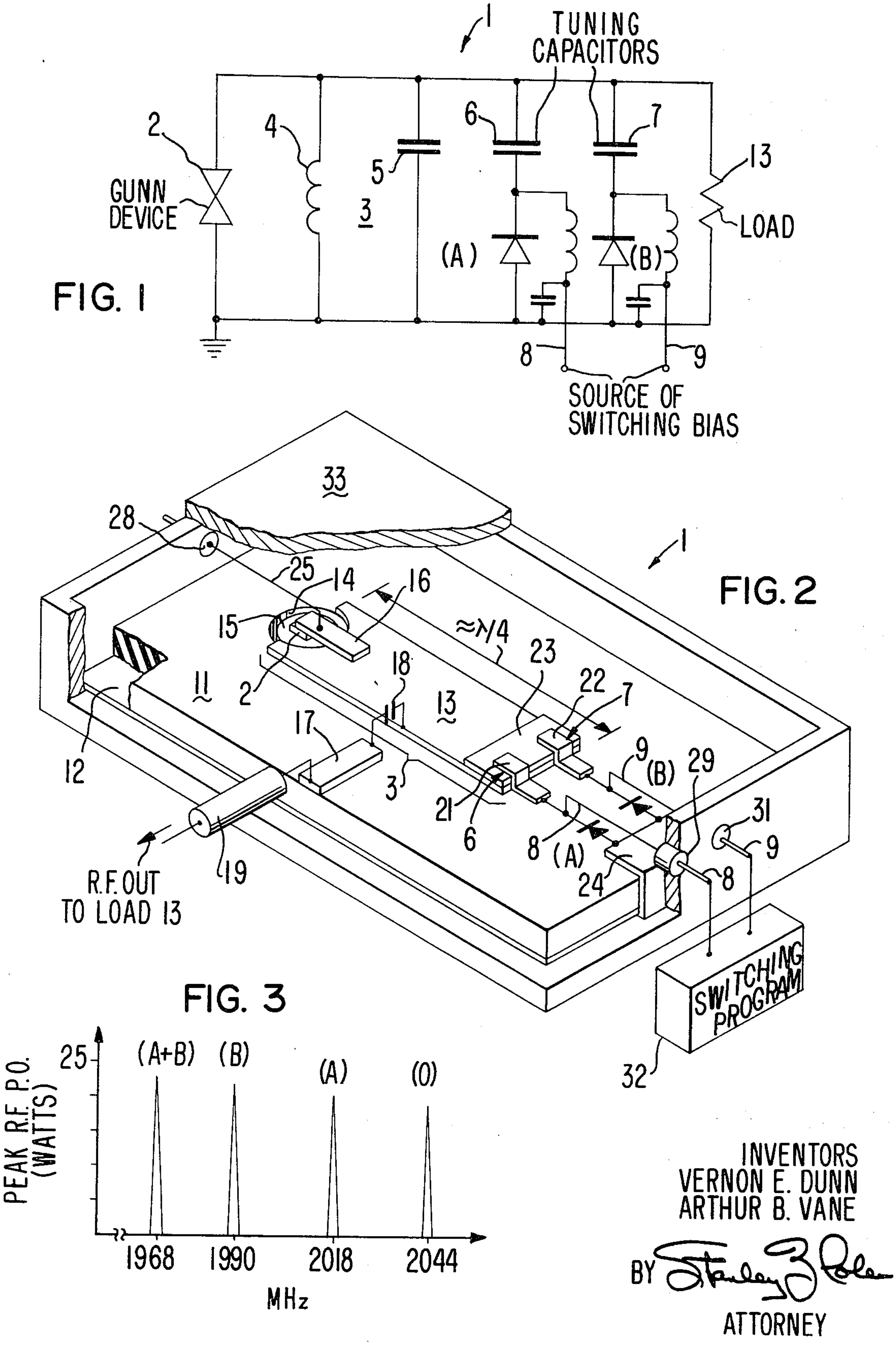
FIG. 1 is a schematic simplified circuit diagram for a microwave oscillator incorporating features of the present invention.
FIG. 2 is a perspective view, partly broken away and partly in schematic form, depicting a microwave oscillator of the present invention.
FIG. 3 is a peak power spectral diagram depicting the tuning characteristics for the microwave oscillator of FIG. 2.
Figure 4:
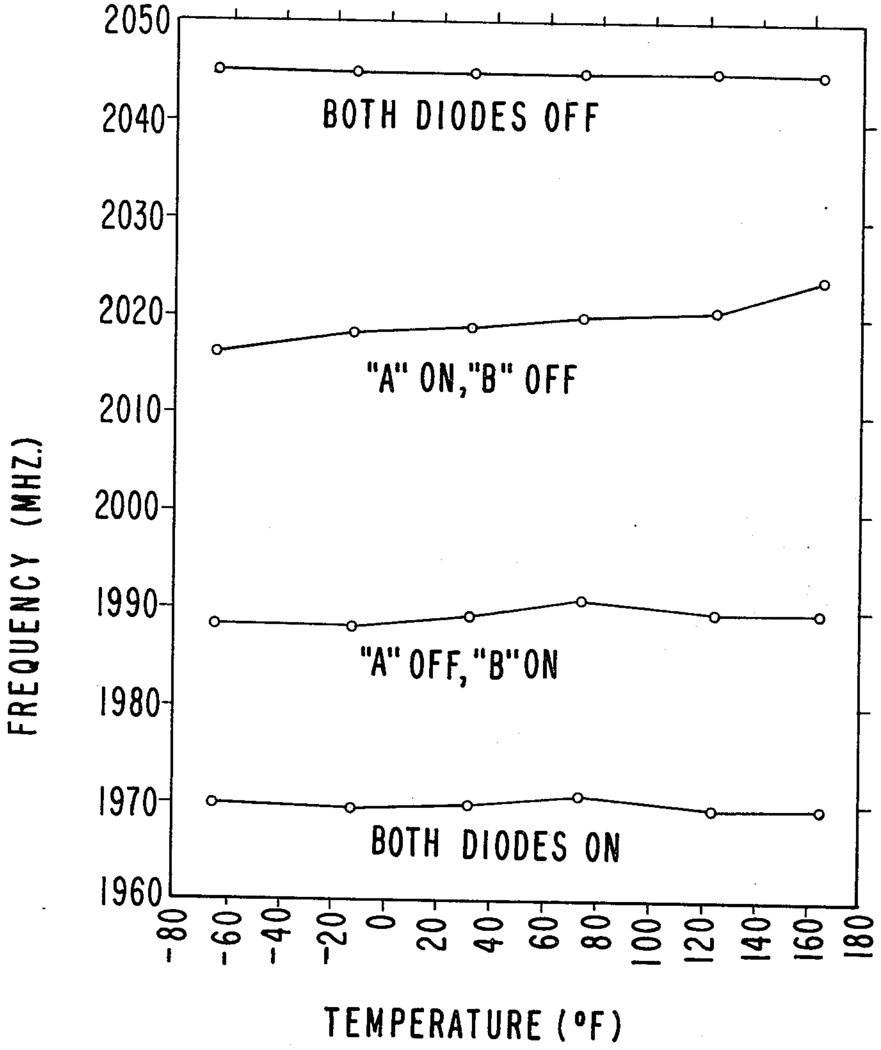
FIG. 4 is a diagram depicting the excellent frequency stability characteristics for the oscillator operating in an ambient temperature from −65°F. to +165°F.

Referring now to FIG. 1, there is shown a simplified equivalent circuit diagram for the microwave stripline oscillator 1 of the present invention. The oscillator circuit 1 comprises a Gunn-effect diode 2 connected across the low impedance end of a quarter wavelength stripline resonator 3, schematically indicated by parallel connected inductor 4 and capacitor 5. The stripline resonator 3 is capacitively loaded at the high impedance end by capacitors 6 and 7 connected in shunt with the resonator 3 via the intermediary of p-i-n diodes A and B, respectively. Capacitors 6 and 7 can be selectively connected and disconnected by changing the bias voltage on p-i-n diodes A and B as applied via the inductive bias leads 8 and 9, respectively. Digital tuning results from the step shifts in shunt capacity to the resonator 3. An output load 13 is connected across the resonator 3 for extracting output microwave energy from the oscillator 1.

The digital tuning characteristics of the oscillator 1 are more clearly seen by reference to FIG. 3. More particularly, with both diodes A and B biased via leads 8 and 9 for a nonconductive or "off" condition, the oscillator is thereby tuned to its highest resonant frequency which is shown to be 2,044 MHz in the diagram of FIG. 3. Peak power of approximately 21 watts is obtained at this frequency. By biasing diode A "on" and diode B "off" the frequency of the oscillator is stepped to 2,018 MHz with a peak power output of approximately 22 watts. When diode A is biased "off" and diode B is biased "on" the oscillator provides a peak RF power output of approximately 24 watts at a frequency of 1,990 MHz. When both diodes A and B are biased "on" the oscillator provides a peak power output of approximately 24 watts at a frequency of 1,968 MHz.

Referring now to FIG. 2, there is shown the physical realization of the microwave oscillator 1 of FIG. 1. The microstrip resonator 3 comprises a dielectric slab 11, as of alumina ceramic 99.5 percent pure, having a ground plane conductive layer 12 bonded to the lower face of the ceramic slab 11 and having a strip conductive layer 13 bonded to the upper face of the slab 11 in registration over the ground plane layer 12. In a typical example, conductive layers 12 and 13 are formed by metallizing the ceramic 11 which has been finished to a 10-microinch finish with approximately 100 A. of chromium overlaid with 300 microinches of gold. In a typical example, the ceramic slab 11 is 0.025 inches thick, the strip conductor 13 is approximately 11/16 inches long and three-eighths of an inch wide.

The Gunn diode 2 is mounted in a hold 14 in the ceramic slab 11 at the low impedance end of the stripline resonator 3. The Gunn diode 2 is soldered to a copper plug 15 disposed in the hole 14 and conductively connected to the substrate conductive layer 12. A metal tab 16 interconnects the upper conductive strip 13 with the Gunn diode 2. In a typical example, the Gunn diode is a 0.050 inch square chip of solution-grown n-type epitaxial gallium arsenide. The 40$\mu$thick active layer of the diode is grown on a tin-doped gallium arsenide substrate which is used as the cathode, and it has a tellurium-doped regrown contact for the anode. The carrier concentration of the active material has a nearly linear change from the $3\times10^{14}$ carriers per cubic centimeter at the cathode to $9\times10^{14}$ near the anode. Ohmic metal contacts are alloyed to both surfaces of the gallium arsenide wafer. The threshold voltage for the Gunn diode is 13.3 volts.

The 50 ohm output stripline 17 is connected to the resonator 3, a short distance from the open circuited end thereof, via the intermediary of a 300 pf chip capacitor 18 serving as a blocking capacitor for blocking the Gunn diode bias voltage from the load. A 50 ohm coaxial line 19 is connected to the stripline for coupling the output microwave energy from the microwave oscillator 1 to the load 13.

Capacitors 6 and 7 are connected, at the high impedance end of the resonator 3, in shunt with the resonator to ground via the intermediary of p-i-n diodes A and b, respectively.

Capacitors 6 and 7 each include a conductive tab of copper foil 21 and 22, respectively, overlaying the high impedance end of the conductive strip 13 of the resonator 3 and insulated from it by a 0.001 inch thick sheet of Mylar tape 23. The p-i-n diode chips A and B are bonded directly to a metallic layer 24 which is conductively connected to the ground plane layer 12. The other leads of the diodes A and B are connected to tabs 21 and 22, respectively. Bias is applied to the Gunn diode 2 and to the p-i-n diodes A and B through rf chokes formed by short lengths of 0.005 inch diameter wire 25, 8 and 9, respectively, which pass through RF bypass capacitors 28, 29 and 31, respectively. Alternatively, the leads 25, 8 and 9 may be choke sections formed from metallized conductors on the surface of slab 11.

Switching bias potential for the p-i-n diodes A and B is derived from a switching program 32 for biasing the p-i-n diodes into a conductive or nonconductive state depending upon the desired output frequency of the microwave oscillator 1. The pulsed Gunn dc bias potential is applied to the Gunn diode via lead 25 from a source of suitable pulsed dc bias potential as of 50 volts peak, not shown, such 50 volts comprising approximately 3.8 times the threshold voltage to obtain a conversion efficiency of approximately 3 to 3.5 percent. In a typical example, with 50 volts dc bias voltage the Gunn diode draws 13.7 amps peak current. Typical pulse lengths are 0.2 microseconds with a pulse repetition frequency of 50 KHz to produce an average power output of approximately 200 milliwatts.

The oscillator circuit 1, thus far described, is enclosed in a conductive enclosure 33, as of aluminum, to prevent stray radiation and to serve as a heat sink for the Gunn diode 2. Electrical conduction is obtained from the ground plane conductor 12 via a physical contact junction with the bottom wall of the enclosure 33. The feedthrough bypass capacitors 28, 29, and 31, as well as the coaxial output line 19, pass through the wall of the conductive enclosure 33.

The stripline oscillator circuit 1 is particularly advantageous because of its small size, its excellent frequency stability as environmental temperature is changed, its adaptability to a circuit in which several active devices are used, and its potentially low production cost. Use of the p-i-n diodes for switching the capacitive reactances into the resonance circuit 3 for changing the operating frequency of the oscillator in discrete frequency steps has the advantage of not being subject to signal level limitations of YIG and varactor tuning.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

WHAT IS CLAIMED IS:

1. In a microwave oscillator circuit, stripline transmission line means having a length to be resonant near the high frequency end of the operating frequency range of the oscillator circuit, a microwave bulk-effect negative-resistance semiconductive means connected in shunt with said resonant stripline means near a microwave voltage null of said stripline means for the fundamental mode of resonance of said stripline resonant means for matching the low impedance of the bulk-effect means to the low impedance of said resonant means near said point of microwave voltage null, THE IMPROVEMENT COMPRISING, capacitor means for tuning said circuit, diode means connected in series with said capacitor means for controlling the operation of said capacitor means, said capacitor means and said diode means being connected in shunt across said stripline at a point near a microwave voltage maximum of said resonant stripline means for the fundamental mode of resonance of said resonant stripline means, and means for applying a bias voltage across said diode means for switching said diode means to a conductive state for microwave energy to switch said tuning capacitor means across said resonant means and tune the oscillator circuit operating frequency from a first frequency to a second frequency in a discrete frequency step within the tunable operating frequency range of the oscillator circuit.

2. The apparatus of claim 1 including a second tuning capacitor means and a second diode means series connected to each other and connected in shunt across said stripline resonator and means for applying a bias voltage across said second diode means independent of the bias voltage, if any, applied across the first diode means for switching said second diode means to a conductive state to switch said second tuning capacitor means across said resonator for tuning said resonator and the oscillator from one frequency to a second frequency in a discrete frequency step within the tunable operating frequency range of the oscillator.

3. The apparatus of claim 1 wherein said stripline resonator means includes, a slab of dielectric material, first and second metallic layers bonded to opposite sides of said slab in transverse registration with each other, said first metallic layer being wider and longer than said second layer to define a ground plane member of said stripline.

4. The apparatus of claim 3 wherein said slab of dielectric material is a slab of alumina ceramic.

5. The apparatus of claim 3 wherein said slab of dielectric material is apertured at one end of said second metallic layer, and said bulk-effect semiconductive means is mounted in the aperture in said dielectric slab.

6. The apparatus of claim 3 wherein said tuning capacitor means includes a sheet of dielectric material disposed overlaying said second metallic layer and a conductive tab member disposed over said dielectric sheet to define said tuning capacitor means by the capacitance between said tab and said second metallic layer.

7. The apparatus of claim 6 wherein said conductive tab member is disposed overlaying the end portion of said second conductive layer which is at the opposite end thereof from said bulk-effect conductive means.

8. The apparatus of claim 1 wherein said bulk-effect negative-resistance semiconductive means is a Gunn diode.

* * * * *